US007666726B2

(12) United States Patent
Utsunomiya et al.

(10) Patent No.: US 7,666,726 B2
(45) Date of Patent: Feb. 23, 2010

(54) SEMICONDUCTOR ELEMENT, SEMICONDUCTOR DEVICE, AND METHOD OF MANUFACTURING THE SAME (75) Inventors: Sumio Utsunomiya, Suwa (JP); Hideto Ishiguro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 46 days.

(21) Appl. No.: 11/690,461

(22) Filed: Mar. 23, 2007

(65) Prior Publication Data
US 2007/0224741 A1 Sep. 27, 2007

(30) Foreign Application Priority Data
Mar. 27, 2006 (JP) ............... 2006-084932
Nov. 27, 2006 (JP) ............... 2006-318109

(51) Int. Cl.
H01L 21/84 (2006.01)
(52) U.S. Cl. ............... 438/166; 257/E21.561; 438/455
(58) Field of Classification Search ......... 438/455–459, 438/151–166; 257/E21.561
See application file for complete search history.

(56) References Cited
U.S. PATENT DOCUMENTS
5,017,508 A * 5/1991 Dodt et al. ............... 438/139
2005/0042840 A1 * 2/2005 Aga et al. ............... 438/458
2007/0069335 A1 * 3/2007 Endo et al. ............... 257/618

OTHER PUBLICATIONS

S. D. Brotherton et al., "Characterisation of Poly-Si TFTs in Directionally Solidified SLS Si," Asia Display/IDW 2001 Proceedings, pp. 387-390.
A. Hara et al., "Ultra-high Performance Poly-Si TFTs on a Glass by a Stable Scanning CW Laser Lateral Crystallization," AM-LCD 2001, Digest of Technical Papers, pp. 227-230.
M. Hatano et al., "System on Glass Display with LTPS-TFTs Formed Using Selax Technology," Proceedings of IDW/AD 2005, pp. 953-956.
Y. Taniguchi et al., "Advanced Phase-Modulators for Next-Generation Low-Temperature Si Film Crystallization Method," Proceedings of IDW/AD 2005, pp. 981-982.
M. He et al., "Effects of Crystallographic Orientation of Single-Crystalline Seed on μ-Czochralski Process in Excimer-Laser Crystallization," Proceedings of IDW/AD 2005, pp. 1213-1214.
R. Ishihara et al., "Single-Crystalline Si Thin-Film Transistors Fabricated with μ-Czochralski (Grain-Filter) Process," AM-LCD 2002 Digest of Technical Papers, pp. 53-56.

* cited by examiner

Primary Examiner—Richard A. Booth
(74) Attorney, Agent, or Firm—Oliff & Berridge, PLC (57) ABSTRACT A method of manufacturing a semiconductor element includes: (a) preparing a first substrate provided with a plurality of protruding sections formed on a surface of the first substrate and a second substrate provided with a semiconductor film formed on a surface of the second substrate; and (b) executing a heat treatment on the semiconductor film while the plurality of protruding sections and the semiconductor film are in contact with each other.

15 Claims, 9 Drawing Sheets

SEMICONDUCTOR ELEMENT, SEMICONDUCTOR DEVICE, AND METHOD OF MANUFACTURING THE SAME

BACKGROUND OF THE INVENTION

1. Technical Field

Several aspects of the present invention relate to a semiconductor film, a semiconductor element, a semiconductor device, and methods of manufacturing them.

2. Related Art

Polysilicon thin film transistor (poly-Si TFT) is used extensively as means for manufacturing high-performance transistor elements on insulating substrates made of glass, quartz, or the like. But, structural defects in the polysilicon thin film strongly affect the performance of the poly-Si TFT. In the polysilicon thin film, there are various kinds of structural defects such as implantation, twin boundary, stacking fault, or grain boundary. Poly-Si TFTs are generally inferior in performance to single crystal silicon elements because these defects prevent electrons/holes from moving in electrical conduction. In order for solving such a problem, a method of enlarging the grain size in the polysilicon thin film on the insulating substrate or a method of partially forming a quasi-single crystal silicon thin film has been reported. Such methods will be listed below.

A sequential lateral solidification (SLS) method is a method for obtaining a polysilicon thin film by irradiating with excimer laser wherein the crystal grains are elongated in the laser scanning direction by setting the pitch in the scanning direction to be extremely small (see, for example, "Characterization of poly-Si TFTs in Directionally Solidified SLS Si" by S. D. Brotherton, et al., Asia Display/IDW '01 Proceedings, pp. 387-390).

A CW-laser lateral crystallization (CLC) method is a method of scanning a substrate with continuous oscillation laser irradiating thereon thereby elongating silicon crystal grains in the laser scanning direction (see, for example, "Ultra-high Performance Poly-Si TFTs on a Glass by a Stable Scanning CW Laser Lateral Crystallization," A. Hara, et al., AM-LCD '01, Digest of Technical Papers, pp. 227-230).

A selectively enlarging laser X'tallization (SELAX) method is a method of performing crystallization with excimer laser and then elongating the existing crystal grains in the laser scanning direction using the continuous oscillation laser (see, for example, "System on Glass Display with LTPS-TFTs Formed using SELAX (Selectively Enlarging Laser X'tallization) Technology," M. Hatano, et al., Proceedings of IDW/AD '05, pp. 953-956).

A phase-mask modulated excimer laser annealing (PMELA) method is a method of forming an excimer laser beam having intensity distribution using a phase mask to perform crystallization of the silicon thin film and making the crystal grains grow in the longitudinal direction using thermal gradient caused between the high intensity area and the low intensity area (see, for example, "Advanced Phase-Modulators for Next-Generation Low-Temperature Si Film Crystallization Method," Y. Taniguchi, et al., Proceedings of IDW/AD '05, pp. 981-982).

A μ-Czochralski method is a method of providing fine holes on a substrate, depositing amorphous silicon thin film so as to cover the fine holes, and irradiating this structure with the excimer laser to promote meltdown/crystallization from the bottoms of the fine holes, thereby selectively allowing only crystals having the fastest growth rate to grow, thus making it possible to obtain a quasi-single crystal silicon thin film (see, for example, "Effects of crystallographic orientation of single-crystalline seed on μ-Czochralski process in excimer-laser crystallization," M. He, et al., proceedings of IDW/AD '05, pp. 1213-1214, and "Single-Crystalline Si Thin-Film Transistors Fabricated with μ-Czochralski (Grain-Filter) process," R. Ishihara, et al., AM-LCD '02 Digest of Technical Papers, pp. 53-56).

By using these methods, a polysilicon thin film including crystal grains with a grain size of greater than several micrometers can be obtained in each of the cases. By manufacturing thin film transistor elements to such a silicon thin film while paying attention to not including a crystal grain, a thin film transistor element having a carrier mobility as high as 300 through 500 $Cm^2/Vs$ or more can be obtained on the insulating substrate in each case.

However, although crystal grains as large as several micrometers can be formed by the method of the related art described above, the crystal orientations of the obtained crystal grains are not controlled, and accordingly, are left in random conditions. Since the carrier mobility is varied depending on the crystal orientation of silicon, the performance is widely varied among the thin film transistors having crystal orientations not unified with each other. In order for achieving further improvement of the electrical characteristics of thin film transistor elements, establishment of a manufacturing method capable of forming a high-quality semiconductor thin film with crystal grains having controlled crystal orientations is desired.

SUMMARY

In view of the above problems, an aspect of the invention has an advantage of providing a semiconductor thin film, a semiconductor device, and methods of manufacturing them capable of obtaining a high-quality single crystal or quasi-single crystal semiconductor film with controlled crystal orientations with efficiency.

According to an aspect of the invention, a method of manufacturing a semiconductor element includes: (a) preparing a first substrate provided with a plurality of protruding sections formed on a surface of the first substrate and a second substrate provided with a semiconductor film formed on a surface of the second substrate; and (b) executing a heat treatment on the semiconductor film while the plurality of protruding sections and the semiconductor film are in contact with each other.

In the method of manufacturing a semiconductor element described above, the semiconductor film can be melted by the heat treatment in step (b).

In the method of manufacturing a semiconductor element described above, a plurality of single crystal grains corresponding to the plurality of protruding sections can be formed in the semiconductor film by performing step (b).

In the method of manufacturing a semiconductor element according to the aspect of the invention, "single crystal grain" denotes a crystalline domain having a predetermined crystal orientation, but can include, for example, a quasi-single crystalline domain, a substantially single crystalline domain, or a domain having a crystalline property relatively improved by executing the heat treatment on the semiconductor film in comparison with the crystalline property of at least a part of the semiconductor film on which the heat treatment is not executed.

In the method of manufacturing a semiconductor element described above, step (c) of separating the first substrate and the second substrate from each other after step (b) may further be included. Thus, reuse of the first substrate thus separated becomes possible.

In the method of manufacturing a semiconductor element described above, the plurality of protruding sections can be made of single crystal silicon.

In the method of manufacturing a semiconductor element described above, the plurality of protruding sections can include an oxide film formed on a surface of each of the plurality of protruding sections. By forming the oxide film on a foundation layer having a predetermined crystal orientation such as single crystal silicon, the oxide film also becomes to have a controlled orientation, thus it becomes possible to improve the crystalline property of the semiconductor film in the heat treatment of the semiconductor film.

In the method of manufacturing a semiconductor element described above, the plurality of protruding sections can include an oxide film formed on a surface of each of the plurality of protruding sections, and the oxide film can be removed in step (c).

In the method of manufacturing a semiconductor element described above, each of the plurality of protruding sections can be made of a porous material.

In the method of manufacturing a semiconductor element described above, each of the plurality of protruding sections can be made of a porous material, and the plurality of protruding sections can be removed in step (c).

In the method of manufacturing a semiconductor element described above, step (b) may include step (b1) of irradiating the semiconductor film with a laser beam from a side of an opposite surface of the second substrate to a surface on which the semiconductor film is formed.

A semiconductor element according to another aspect of the invention is manufactured by the method of manufacturing a semiconductor element described above.

A method of manufacturing a semiconductor device according to another aspect of the invention includes the method of manufacturing a semiconductor element described above.

A semiconductor device according to still another aspect of the invention is manufactured by the method of manufacturing a semiconductor device described above.

According to another aspect of the invention, a method of manufacturing a semiconductor thin film includes: bonding a single crystal semiconductor substrate provided with a plurality of protruding sections arranged on a surface of the single crystal semiconductor substrate and a light transmissive substrate provided with a semiconductor thin film deposited on a surface of the light transmissive substrate so that the surfaces of the both substrates face each other; forming a quasi-single crystal semiconductor thin film on the light transmissive substrate, the quasi-single crystal semiconductor thin film being composed of a plurality of substantially single crystal grains each started from respective one of the plurality of protruding sections, by executing a heat treatment on the semiconductor thin film to melt and crystallize the semiconductor thin film; and separating the light transmissive substrate including the quasi-single crystal semiconductor thin film and the single crystal semiconductor substrate from each other. According to this aspect of the invention, the quasi-single crystal semiconductor thin film can be obtained on the light transmissive substrate. Since the resulting quasi-single crystal semiconductor thin film is composed of the substantially single crystal grains each formed in a range substantially centered on the protruding section of the single crystal semiconductor substrate, the grain size becomes large, and the crystal orientation is controlled, thus a superior semiconductor performance substantially equivalent to single crystal silicon or SOI can be obtained. Further, since the positions of the crystal growth sections can precisely be controlled, the high-quality quasi-single crystal semiconductor thin film can efficiently be obtained only on the necessary part of the light transmissive substrate.

Regarding the method of manufacturing a semiconductor thin film, the single crystal semiconductor substrate can be provided with a oxide film formed on the surface including the plurality of protruding sections, and the oxide film can be removed in the separation step.

Regarding the method of manufacturing a semiconductor thin film, the single crystal semiconductor substrate can be provided with a plurality of protruding sections made of a porous material, and the plurality of protruding sections can be removed in the separation step.

Regarding the method of manufacturing a semiconductor thin film, the step of forming the quasi-single crystal semiconductor thin film can include the step of irradiating the semiconductor thin film with a laser beam from a side of an opposite surface of the light transmissive substrate to the surface on which the semiconductor thin film is formed.

A semiconductor thin film according to another aspect of the invention is manufactured by the method of manufacturing a semiconductor thin film described above.

A method of manufacturing a semiconductor device according to another aspect of the invention includes the method of manufacturing a semiconductor thin film described above.

A semiconductor device according to another aspect of the invention is manufactured by the method of manufacturing a semiconductor device described above.

BRIEF DESCRIPTION OF THE DRAWINGS

The invention will now be described with reference to the accompanying drawings, wherein like numbers refer to like elements.

DESCRIPTION OF THE EMBODIMENTS

Hereinafter, embodiments of the invention will be described with reference to the accompanying drawings.

Figure 1A:
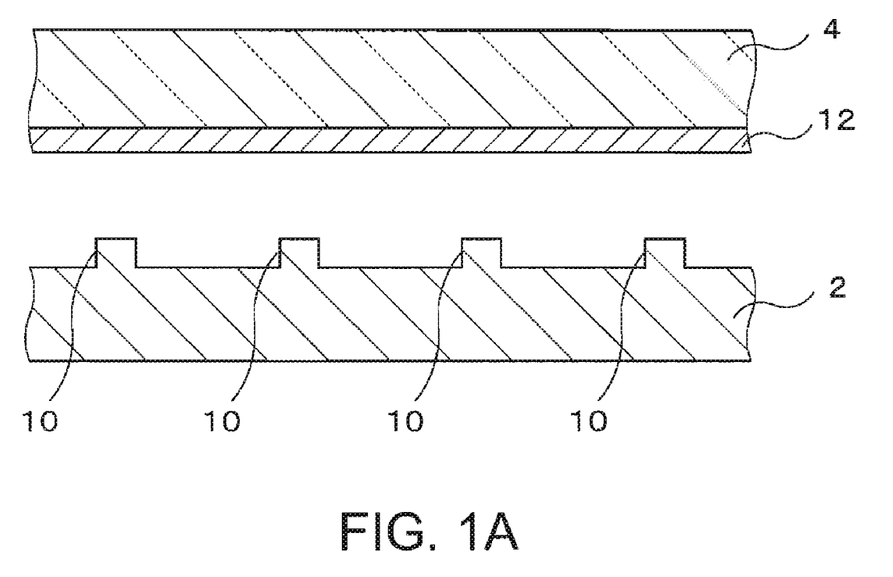
FIGS. 1A and 1B are diagrams showing a method of manufacturing a semiconductor thin film according to an embodiment of the invention.

FIGS. 1A, 1B, 2A, and 2B are diagrams showing a method of manufacturing a semiconductor thin film according to an embodiment of the invention. In the method of manufacturing a semiconductor thin film according to the present embodiment, an amorphous silicon thin film (hereinafter referred to as a silicon thin film) 12 as a semiconductor thin film is firstly deposited on a light transmissive substrate 4 as shown in FIG. 1A. The silicon thin film 12 can also be deposited on the light transmissive substrate 4 to have a thickness of about 100 nm by a plasma enhanced chemical vapor deposition process (PECVD process), a low pressure chemical vapor deposition process (LPCVD process), or the like. It should be noted that the insulating material for forming the light transmissive substrate 4 is not limited to glass. Non-alkali glass for liquid crystal or quartz, for example, can be used for the light transmissive substrate 4. It is desirable that the surface roughness of the light transmissive substrate 4 is as small as possible. This is because the light transmissive substrate 4 abuts on a single crystal semiconductor substrate described later. Subsequently, a single crystal silicon substrate 2 as a single crystal semiconductor substrate provided with protruding sections 10 on the surface thereof is prepared. It is desirable that the single silicon substrate 2 is thin to some extent for following any unevenness in the height of the surface caused by any curvature or unevenness in the thickness of the light transmissive substrate 4 facing to the single silicon substrate 2. Specifically, the single crystal silicon substrate 2 with a thickness of, for example, about 50 µm through 500 µm can be adhered to the light transmissive substrate 4 with application of pressure. The single crystal silicon substrate with the thickness no greater than 50 µm is difficult to maintain the strength, and the single crystal silicon substrate 2 with the thickness no smaller than 500 µm has degraded adhesiveness to the light transmissive substrate 4.

Figure 1B:
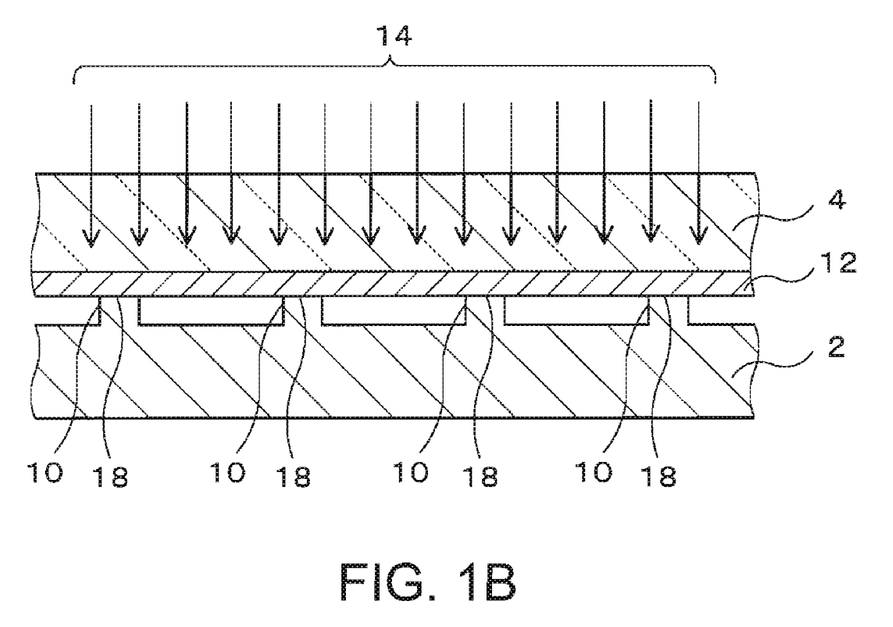

Subsequently, as shown in FIG. 1B, the single crystal silicon substrate 2 provided with the protruding sections 10 on the surface thereof and the light transmissive substrate 4 provided with the silicon thin film 12 stacked on the surface thereof are bonded with each other so that the surfaces thereof face each other. In this case, the protruding sections 10 of the single crystal silicon substrate 2 and the silicon thin film 12 formed on the light transmissive substrate 4 are in condition of abutting on each other at contact points 18. Subsequently, in the condition in which the contact points 18. of the protruding sections 10 of the single crystal silicon substrate 2 and the silicon thin film 12 formed on the light transmissive substrate 4 abut on each other, a heat treatment is executed on the silicon thin film 12 of the light transmissive substrate 4.

As a method of executing the heat treatment on the silicon thin film 12, excimer laser, YAG laser, or other radio frequency waves can preferably be used. For example, the excimer laser 14 is irradiated from the opposite side of the light transmissive substrate 4 to the surface thereof with the silicon thin film 12. The laser irradiation is preferably executed using XeCl pulse excimer laser having, for example, a wave length of 308 nm and a pulse width of 100 ns through 300 ns with the energy density of about 0.4 through 1.5 J/cm$^2$. By irradiating with the laser under such conditions, most of the irradiated laser is absorbed in the vicinity of the surface of the silicon thin film 12. This is because the absorption coefficient of the amorphous silicon in the wave length (308 nm) of the XeCl pulse excimer laser is relatively large as 0.139 nm$^{-1}$.

By appropriately selecting the laser irradiation conditions as described above, it is arranged that the semiconductor film containing a crystalline component in the vicinity of the protruding sections 10 is not completely melted throughout the area in the film thickness direction and partially remains unmelted to some extent while the silicon thin film 12 in other areas than the protruding sections 10 is completely melted throughout the area in the film thickness direction. Thus, the silicon crystal growth after the laser irradiation begins earlier in the vicinity of the contact points 18 of the protruding sections 10 and propagates itself to the vicinity of the surface of the silicon film 12, namely the almost completely melted part. It should be noted that the heat treatment can be fractionated and performed a plurality of times for respective fractions. Thus, the phenomenon described above can be enhanced because the crystal growth occurs a plurality of times.

Figure 2A:
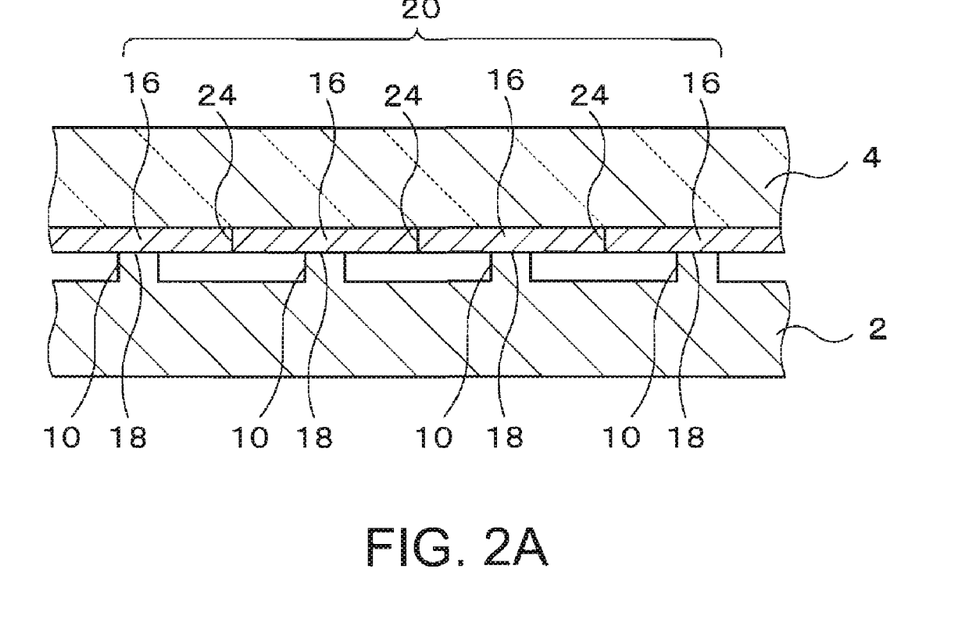
FIGS. 2A and 2B are diagrams showing the method of manufacturing a semiconductor thin film according to the embodiment of the invention.

Subsequently, as shown in FIG. 2A, the silicon thin film 12 on which the heat treatment is executed is melted instantaneously, and then phase-transformed to a plurality of crystalline silicon sections 16 as substantially single crystal grains bounded by grain boundaries 24 in the process of heat radiation (cooling) and fixing of the melted silicon thin film 12. In this case, since the heat radiation (cooling) of the contact points 18 at which the silicon thin film 12 and the protruding sections 10 of the single crystal silicon substrate 2 is performed first with priority, the crystal growth proceeds from the contact points 18 as origins. This is because in cooling the silicon thin film 12, the heat diffusion is caused first with priority in the contact points 18 of the protruding sections 10 of the single crystal silicon substrate 2 as a silicon material having higher thermal conductivity than air, vacuum, or glass material, and thus the contact points 18 is cooled first. Since the crystal growth proceeds independently from the contact points 18, the resulting crystalline silicon sections 16 are polysilicon thin film in the strict sense. However, since all of the protruding sections 10 have the same crystal orientations, the resulting crystalline silicon sections 16 are polycrystal but each have the same orientation. Thus, a quasi-single crystal silicon thin film 20 as a quasi-single crystal semiconductor thin film composed of the crystalline silicon sections 16 is formed.

Figure 3:
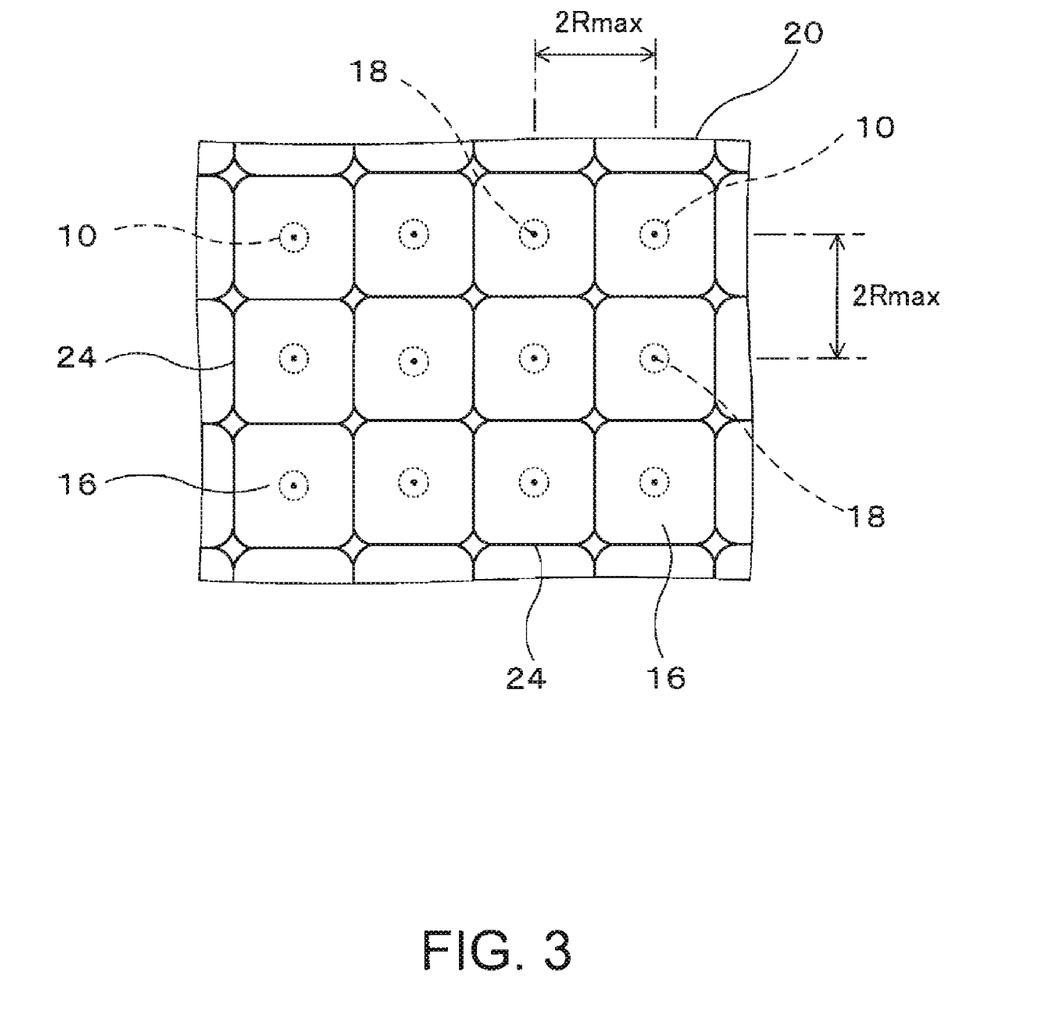
FIG. 3 is a diagram showing the semiconductor thin film according to the embodiment of the invention.

FIG. 3 is a diagram showing the condition in this stage viewed from a direction perpendicular to the surface of the light transmissive substrate 4. As shown in FIG. 3, each of the crystalline silicon sections 16 grows from respective one of the contact points 18 of the protruding sections 10 as the origin. Although there is a limitation Rmax of the distance of growth of the crystalline silicon sections 16 in every direction, it becomes possible that the crystalline silicon sections 16 abut on each other bounded by the grain boundaries 24 to fully cover substantially the entire surface of the light transmissive substrate 4 by setting the distance between the protruding sections 10 to no greater than 2Rmax. As described above, since the crystalline silicon sections 16 bounded by the grain boundaries 24 have the same crystal orientations, the crystalline structure is substantially equivalent to a crystalline structure without the grain boundaries 24.

Therefore, although the silicon thin film 12 is a polycrystal, the resulting thin film is formed as the quasi-single crystal silicon thin film 20 having the same orientations. For example, the protruding sections 10 are formed on the single crystal silicon substrate 2 in intervals of several through several tens of micrometers and each shaped like a cylindrical or a square having a diameter or a size of about 0.1 µm through 5 µm. Although the epitaxial growth of the silicon thin film 12 is started independently from each of the protruding sections 10, since the contact points 18 of all of the protruding sections 10 as the origins of the growth are parts of the surface of the same single crystal silicon substrate 2, the crystal orientations of the crystals growing from the contact points 18 are also the same. Therefore, the quasi-single crystal silicon thin film 20 as the quasi-single crystal semiconductor thin film having the same orientations throughout the entire surface of the light transmissive substrate 4 can be obtained.

By irradiating the silicon thin film 12 with the laser, the silicon thin film 12 is melted and then crystallized from the contact points 18 of the protruding sections 10 as the origins to form the crystalline silicon sections 16. Thus, the crystalline silicon sections 16 centered on the respective contact points 18 of the protruding sections 10, specifically the substantially single crystal silicon film composed of large sized grains can be formed. Since the contact points 18 of the protruding sections 10 exert an effect of adjusting crystal orientations of the crystals in the melting and crystallization process, it becomes possible to substantially control the crystal orientations of the crystalline silicon sections 16 in a specific direction.

Figure 2B:
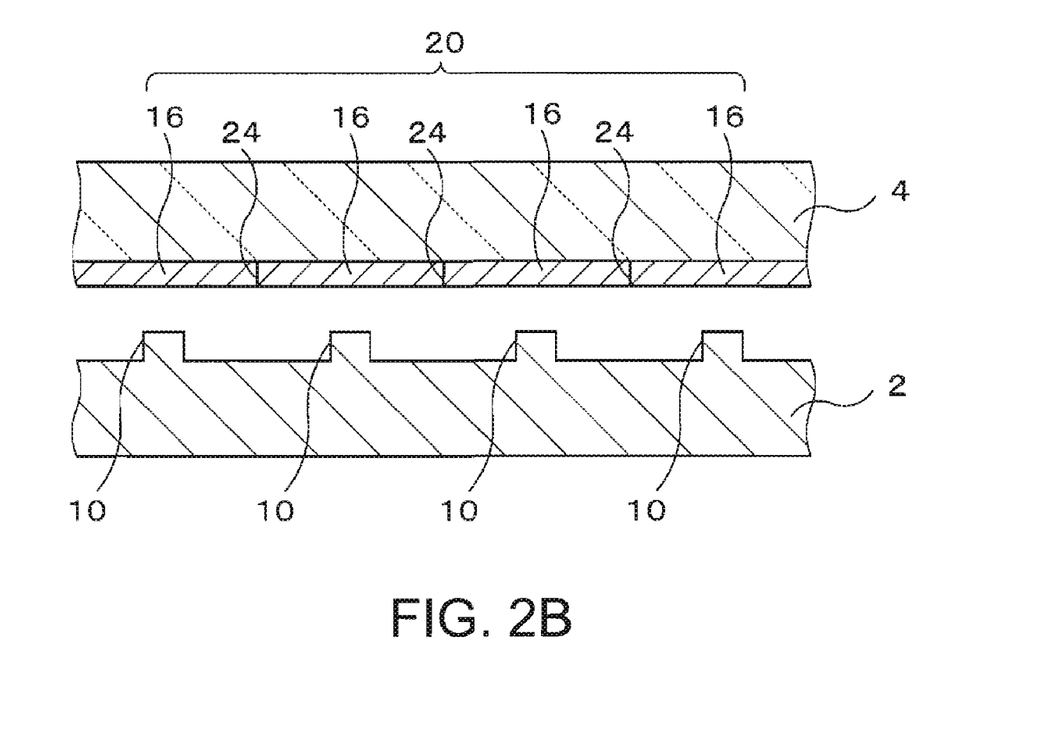

Finally, as shown in FIG. 2B, the single crystal silicon substrate 2 and the quasi-single crystal silicon thin film 20 are separated from each other to obtain the quasi-single crystal silicon thin film 20 formed of the crystalline silicon sections 16, thus the process of manufacturing a semiconductor thin film is terminated. As described above, by separating the single crystal silicon substrate 2 and the light transmissive substrate 4 from each other after forming the quasi-single crystal silicon thin film 20 on the light transmissive substrate 4, the high-quality quasi-single crystal silicon thin film 20 can be obtained on the light transmissive substrate 4. Therefore, the quasi-single crystal silicon thin film 20 can be obtained on the light transmissive substrate 4. Since the resulting quasi-single crystal silicon thin film 20 is composed of the crystalline silicon sections 16 each formed in an area substantially centered on the respective one of the contact points 18 of the protruding sections 10 of the single crystal silicon substrate 2, the resulting quasi-single crystal silicon thin film 20 has the large sized grains having controlled crystal orientations, thus offering superior semiconductor performances substantially equivalent to the single crystal silicon or the SOI. Further, since the positions of the crystal growth sections can precisely be controlled, the high-quality quasi-single crystal silicon thin film 20 can efficiently be obtained only on the necessary part of the light transmissive substrate 4. It should be noted that the single crystal silicon substrate 2 used once can be used repeatedly after separated therefrom.

Figure 4A:
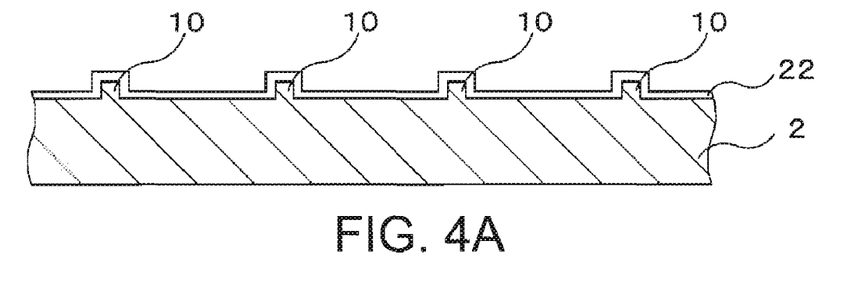
FIGS. 4A through 4C are diagrams showing a substrate separation process according to the embodiment of the invention.
Figure 4B:
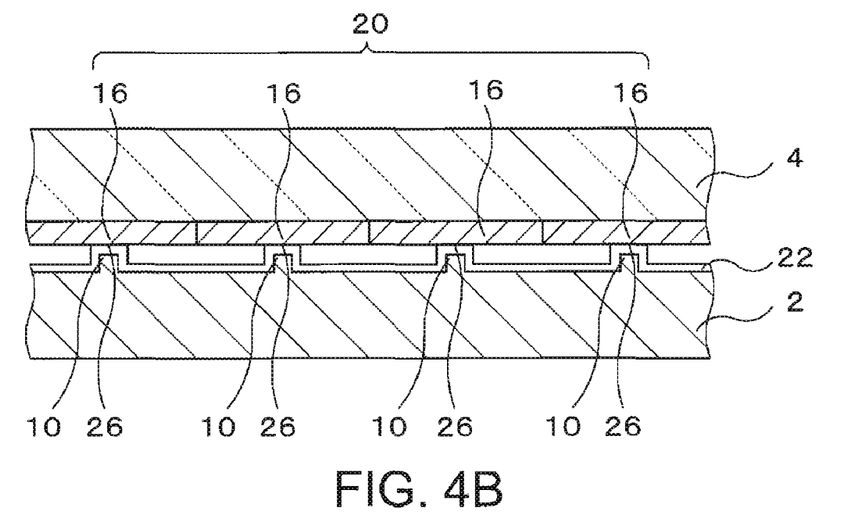
Figure 4C:
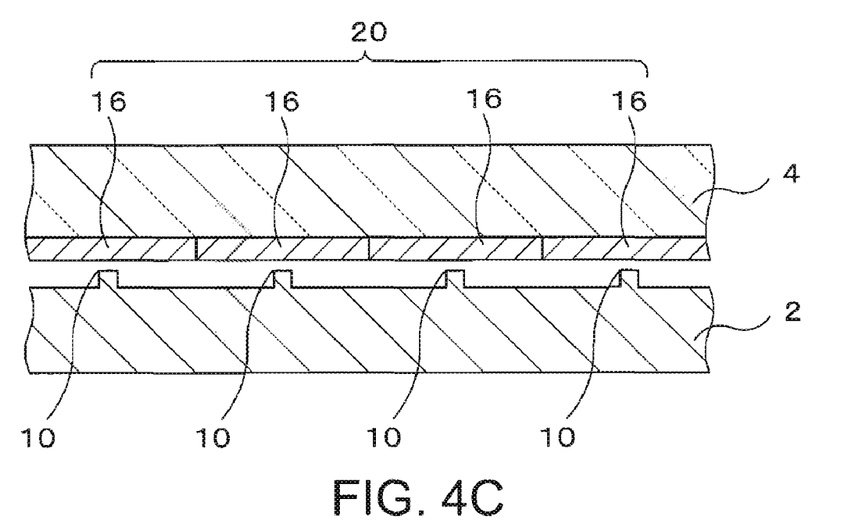

FIGS. 4A through 4C, and 5A through 5D are process diagrams showing means for easily performing the substrate separation process shown in FIG. 2B. FIGS. 4A through 4C show an example of forming a thin oxide layer 92 on the surface of the single crystal silicon substrate 2 provided with the protruding sections 10. Firstly, as shown in FIG. 4A, the thin oxide layer 22 is formed on the surface of the single crystal silicon substrate 2 provided with the protruding sections 10. The oxide layer 22 with a too large thickness hinders the epitaxial growth of the silicon thin film 12, and accordingly the thickness is set preferably to as thin as 1 nm through 100 nm, and more preferably to 1 nm through 10 nm.

Subsequently, as shown in FIG. 4B, the oxide layer 22 becomes to have the crystalline structure reflecting the orientation of the original single crystal silicon, and accordingly, the epitaxial growth of the silicon thin film 12 from the contact points 26 of the oxide layer 22 is possible. Thus, the quasi-single crystal silicon thin film 20 composed of the crystalline silicon sections 16 is formed.

Subsequently, as shown in FIG. 4C, by removing the oxide layer 22 using, for example, an HF aqueous solution or the like in the separation process of the single crystal silicon substrate 2 and the light transmissive substrate 4, the separation of the single crystal silicon substrate 2 and the light transmissive substrate 4 becomes easy.

Further, it is also effective means that the surface of the single silicon substrate 30 is previously formed as a porous single crystal silicon layer 32, as shown in FIGS. 5A through 5D, and porous protruding sections 34 are provided in the porous single crystal silicon layer 32. Since the porous protruding sections 34 have the same crystal orientations as the original single crystal silicon substrate 30, the epitaxial growth of the silicon thin film 12 can easily be achieved. Moreover, since the porous protruding sections 34 can be separated by etching or mechanically when separating the single crystal silicon substrate 30 and the light transmissive substrate 4 from each other, the single crystal silicon substrate 30 and the light transmissive substrate 4 can easily be separated from each other.

Figure 5A:
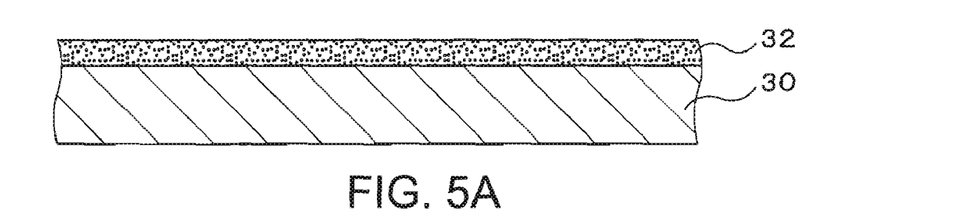
FIGS. 5A through 5D are diagrams showing the substrate separation process according to the embodiment of the invention.

Firstly, as shown in FIG. 5A, the porous single crystal silicon layer 32 is formed on the surface of the single crystal silicon substrate 30 by executing, for example, an electrolytic etching treatment on the surface.

Figure 5B:
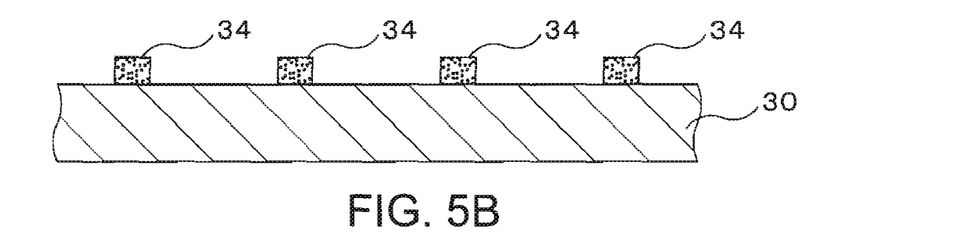

Subsequently, as shown in FIG. 5B, the porous single crystal silicon layer 32 is processed to be the protruding sections 34.

Figure 5C:
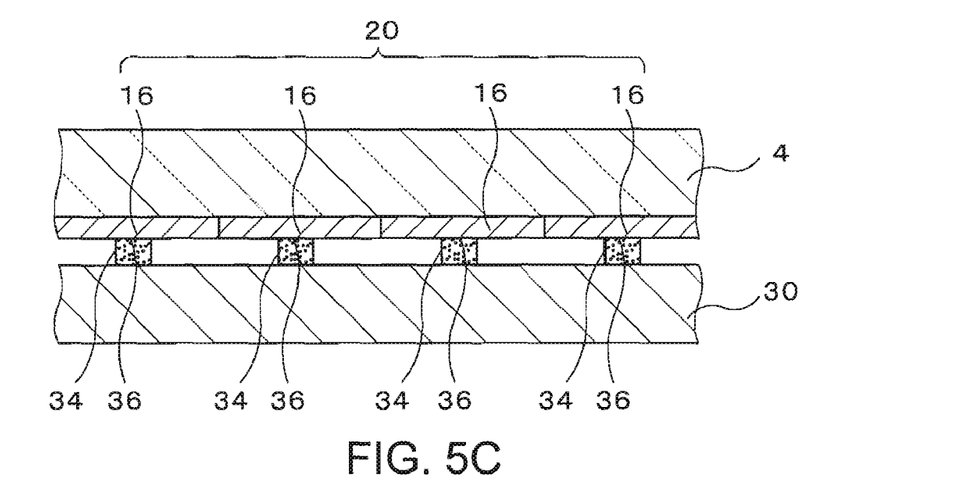

Subsequently, as shown in FIG. 5C, the quasi-single crystal silicon thin film 20 composed of the crystalline silicon sections 16 is formed using contact points 36 of the protruding sections 34 as origins.

Figure 5D:
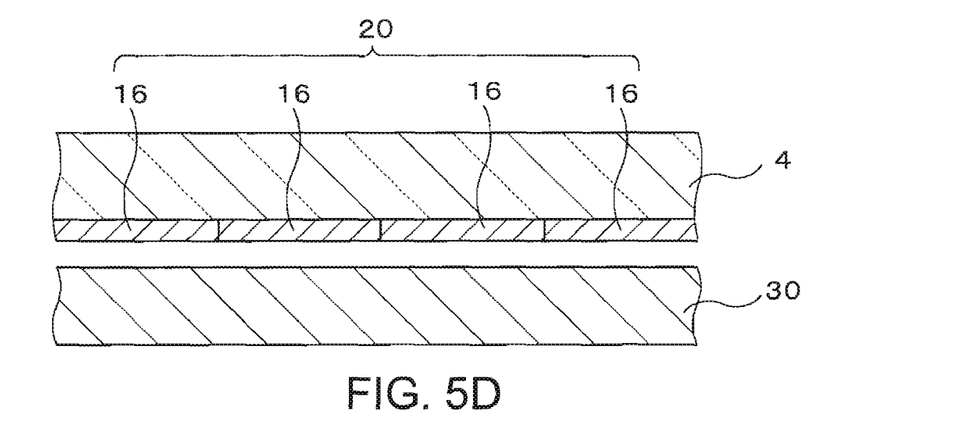

Subsequently, as shown in FIG. 5D, by chemical etching or mechanically breaking the protruding sections 34 (the porous single crystal silicon layer 32) when separating the single crystal silicon substrate 30 and the light transmissive substrate 4, the single crystal silicon substrate 30 and the light transmissive substrate 4 can easily be separated from each other.

Figure 6A:
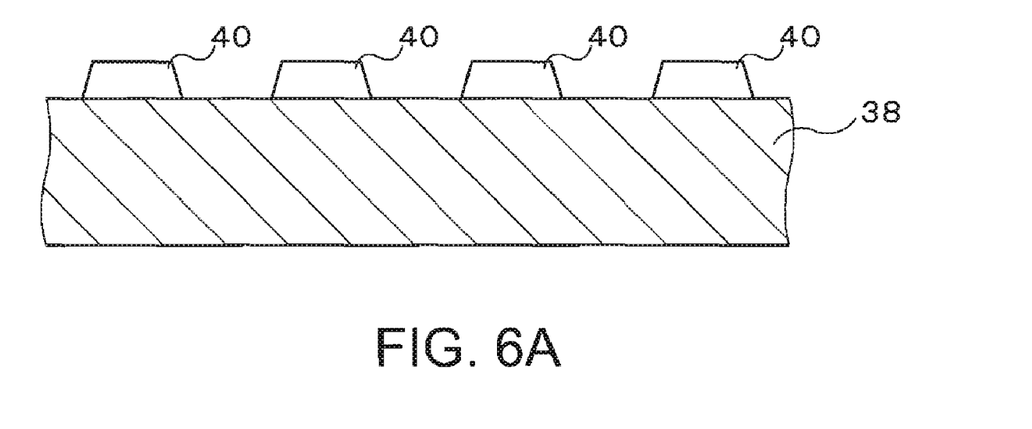
FIGS. 6A through 6C are diagrams showing the method of manufacturing a semiconductor thin film according to the embodiment of the invention.
Figure 6B:
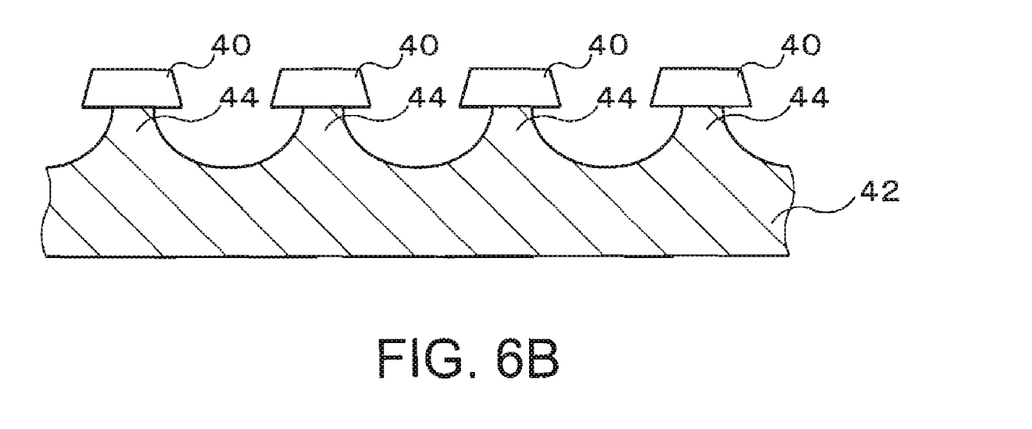
Figure 6C:
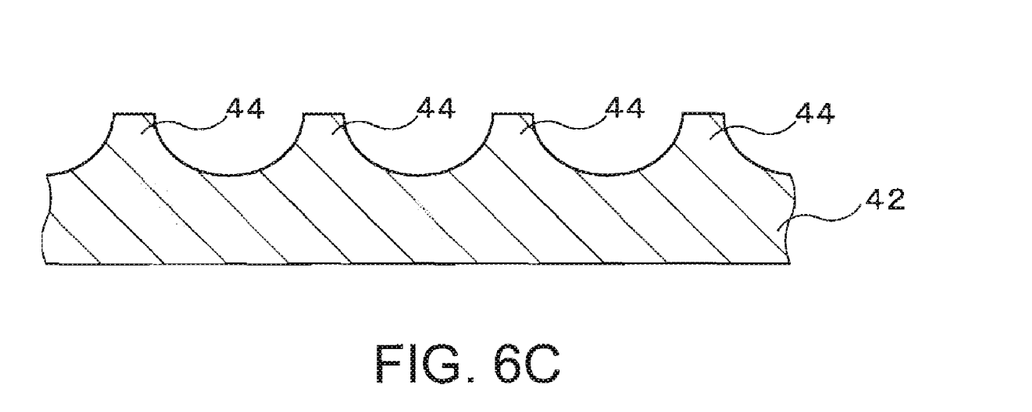
Figure 7A:
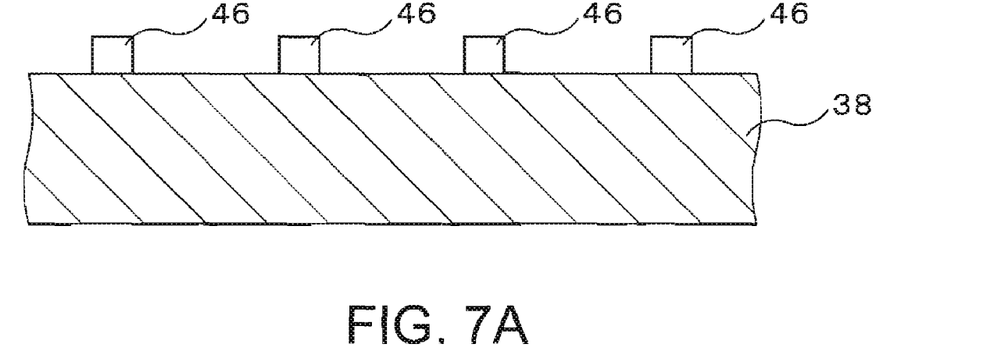
FIGS. 7A through 7C are diagrams showing the method of manufacturing a semiconductor thin film according to the embodiment of the invention.
Figure 7B:
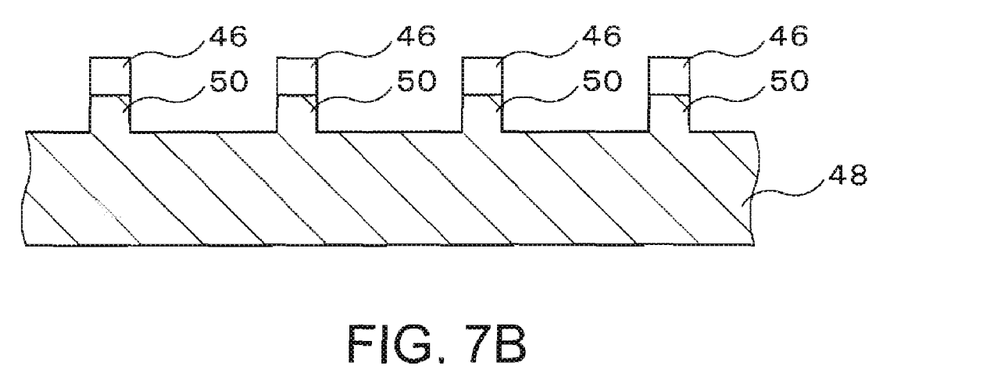
Figure 7C:
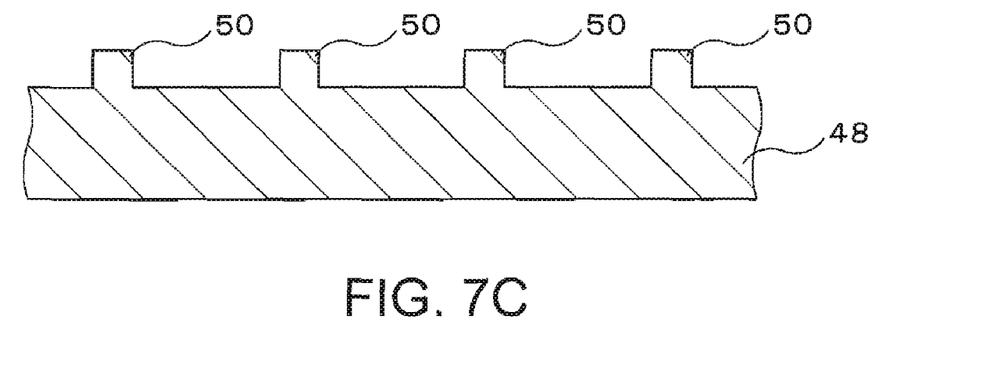

FIGS. 6A through 6C, and 7A through 7C show processes for providing protruding sections to the single crystal silicon substrate 38. FIGS. 6A through 6C show the process of forming a single crystal silicon substrate 42 provided with protruding sections 44 by processing parts of the single crystal silicon substrate 38 exposed from a predetermined patterning configuration of a resist 40 on the single crystal silicon substrate 38 with wet etching. FIGS. 7A through 7C show the process of forming a single crystal silicon substrate 48 provided with protruding sections 50 by processing parts of the single crystal silicon substrate 38 exposed from a predetermined patterning configuration of a resist 46 on the single crystal silicon substrate 38 with anisotropic dry etching.

As described above, according to the methods of manufacturing a semiconductor thin film according to the present embodiment, the high-quality quasi-single crystal silicon thin film 20 can be obtained on the light transmissive substrate 4. The quasi-single crystal silicon thin film 20 as the semiconductor thin film formed by the methods of manufacturing a semiconductor thin film according to the present embodiment has the same crystal orientation in every place, and accordingly, exerts the superior semiconductor performance substantially equivalent to the single crystal silicon or the SOI. It should be noted that although the explanations are presented here exemplifying silicon used in most general purpose, in principle, the material is not limited to silicon but can be a material which can be applied to various semiconductor materials such as germanium, gallium, or gallium arsenide. It should be noted here that in the present specification, "a substantially single crystal grain" includes not only the case in which the crystal grain is single but also the condition similar to this case, namely the case in which only a small number of crystals are combined, and the equivalent characteristic to the semiconductor thin film formed of substantially single crystals is provided from the view point of the characteristic of the semiconductor thin film.

FIGS. 8A through 8D show a method of manufacturing a semiconductor element using the semiconductor thin film according to the present embodiment. A process of forming a thin film transistor 6 as a semiconductor element using the quasi-single crystal silicon thin film 20 according to the present embodiment will be explained. Firstly, the light transmissive substrate 4 provided with the quasi-single crystal silicon thin film 20 is prepared.

Figure 8A:
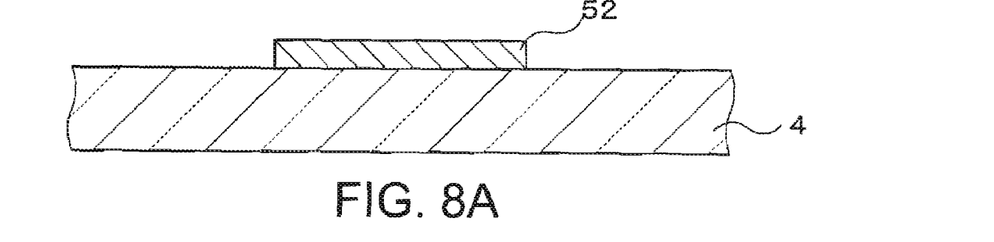
FIGS. 8A through 8D are diagrams showing a method of manufacturing a semiconductor element according to an embodiment of the invention.

Subsequently, as shown in FIG. 8A, the quasi-single crystal silicon thin film 20 is patterned to remove unnecessary portions for forming the thin film transistor, thus forming a quasi-single crystal silicon thin film 52. For example, the quasi-single crystal silicon thin film 52 is formed so as not to include the grain boundary 24 (see FIG. 3).

Figure 8B:
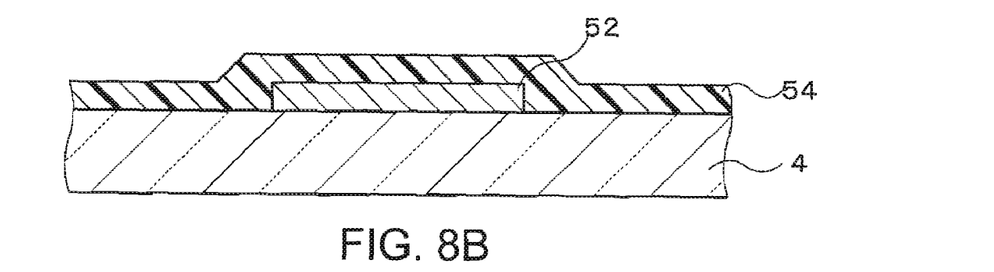

Subsequently, as shown in FIG. 8B, a silicon oxide film 54 is formed on the upper surfaces of the light transmissive substrate 4 and the quasi-single crystal silicon thin film 52 by a film forming process such as an electron cyclotron resonance PECVD process (ECR-PECVD process) or a parallel plate PECVD process. The silicon oxide film 54 functions as a gate insulating film of the thin film transistor.

Figure 8C:
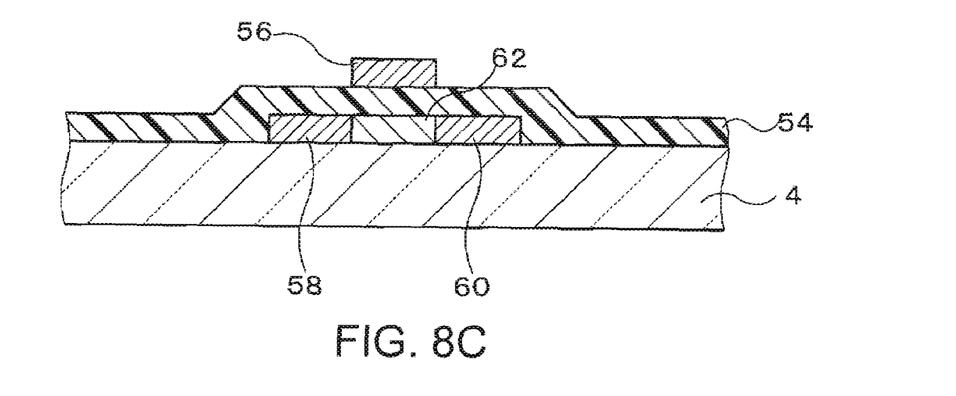

Subsequently, as shown in FIG. 8C, a conductive material thin film made of tantalum, aluminum, or the like is formed using a film forming process such as a sputtering process, and then a gate electrode 56 and a gate wiring film (not shown) are formed by patterning the conductive material thin film. Subsequently, a source region 58, a drain region 60, and an active region 62 are formed in the quasi-single crystal silicon thin film 52 by executing so-called self-aligning ion implantation in which impurity elements acting as donors or acceptors are implanted using the gate electrode 56 as a mask. For example, in the present embodiment, an N-type thin film transistor is formed by implanting phosphorous (P) as the impurity element, and then, irradiating with XeCl excimer laser adjusted to have an energy density of about 400 mJ/cm$^2$ to activate the impurity element. It should be noted that the impurity element can be activated by executing a heating process at a temperature of about 250° C. through 400° C. instead of the laser irradiation.

Figure 8D:
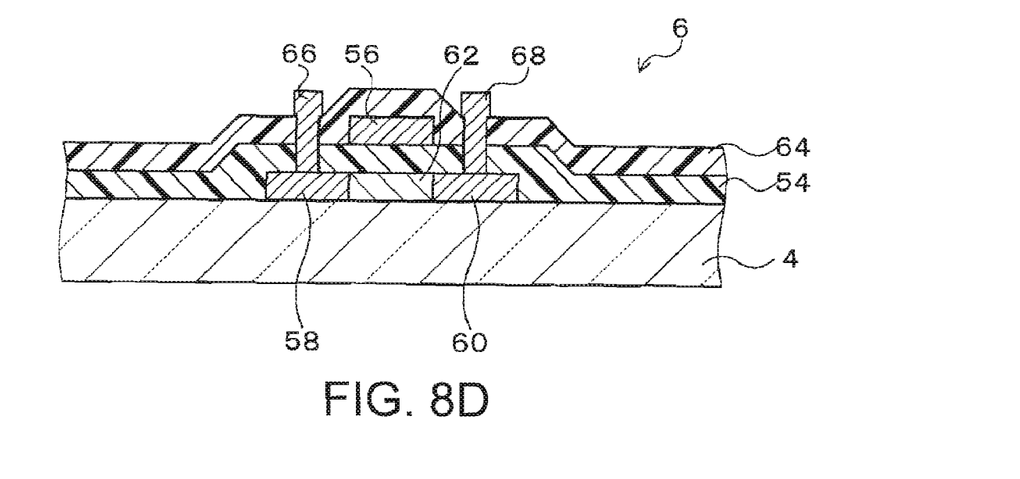

Subsequently, as shown in FIG. 8D, a silicon oxide film 64 of about 500 nm thick is formed on the upper surfaces of the silicon oxide film 54 and the gate electrode 56 with a film forming process such as a PECVD process. Subsequently, a source electrode 66 and a drain electrode 68 are formed by forming contact holes respectively reaching the source region 58 and the drain region 60 through the silicon oxide films 54, 64, and then filling in the contact holes with a conducting material such as aluminum or tungsten with a film forming process such as a sputtering process to pattern the contact holes. Thus, as shown in FIG. 8D, a nickel film as a crystallization promoting film made of a metal containing material and for promoting crystallization of the semiconductor film is disposed adjacent to the bottoms of the protruding sections, thus the thin film transistor 6 provided with the active region 62 and so on using the quasi-single crystal silicon thin film 52 formed by performing the crystallization started from the protruding sections as the origins can be obtained. It should be noted that known processes can be used for processing methods not explained in the above processes.

By using the quasi-single crystal silicon thin film 52 for the active region 62 of the thin film transistor 6, a high-performance thin film transistor with low off-current and large mobility can be formed. It should be noted that in the present embodiment "semiconductor element" includes various kinds of transistors, diodes, resistors, inductors, capacitors, and other elements which can be manufactured with a combination of N-type and P-type semiconductor without distinction of active elements or passive elements.

Figure 9:
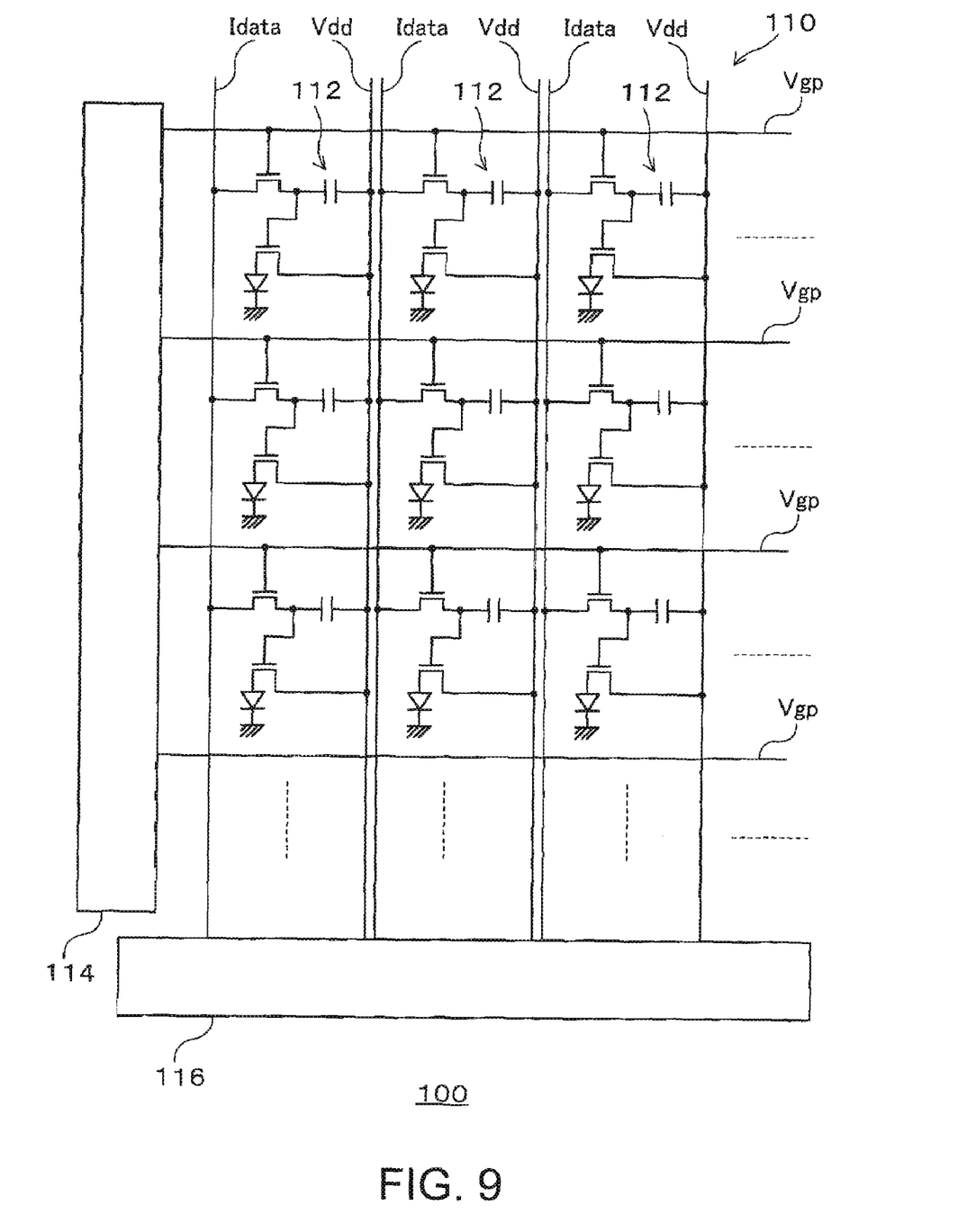
FIG. 9 is a diagram showing a semiconductor device according to an embodiment of the invention.

FIG. 9 shows a semiconductor device using the semiconductor element according to the present embodiment. An organic EL display 100 as a semiconductor device is manufactured using the thin film transistor according to the present embodiment. Processes known to the public can be applied to processing method of the processes.

As shown in FIG. 9, the organic EL display 100 is configured disposing pixel areas 112 inside a display area 110. In each of the pixel areas 112, thin film transistors are used for driving an organic EL light emitting element. As the thin film transistors, those manufactured by the manufacturing process of the embodiment described above are used. A light emission control line (Vgp) and a write control line are supplied from a driver area 114 to each of the pixel areas. A current line (Idata) and a power supply line (Vdd) are supplied from a driver area 116 to each of the pixel areas. Current programming to each of the pixel areas is executed by controlling the write control line and the constant current line Idata, and by controlling the light emission control line Vgp, light emission is controlled. It should be noted that the thin film transistors according to the embodiment of the invention can also be used for the driver areas 114 and 116. Further, the semiconductor thin film according to the embodiment of the invention can be applied not only to the example described above but also to any semiconductor devices capable of applying a semiconductor element. The semiconductor thin film can also be used advantageously in, for example, liquid crystal displays, storage devices, processing devices, and so on besides the above.

By manufacturing an apparatus including an integrated circuit and so on as the semiconductor device (e.g., a liquid crystal display, an organic EL display, a storage device, or a processing device), which is a device configured including the semiconductor element according to the present embodiment, an apparatus including an extremely high-performance and homogeneous integrated circuit and so on can be manufactured. It should be noted that in the present embodiment "semiconductor device" denotes a device configured including a semiconductor element, and a device including, for example, an integrated circuit and so on. By using the quasi-single crystal semiconductor thin film according to the present embodiment, it becomes possible to obtain a semiconductor element and a semiconductor device superior in electrical characteristics. It should be noted that in the case of using a material having a light blocking property as the crystallization promoting film, incident light to a part (e.g., an active region and so on of a thin film transistor) of the semiconductor element composed of the quasi-single crystal semiconductor thin film can be blocked by the crystallization promoting film, thus it becomes also possible to prevent the electromotive force or the dark current from being caused on the quasi-single crystal semiconductor thin film by the light excitation.

What is claimed is:

1. A method of manufacturing a semiconductor element, comprising:

preparing a single crystal semiconductor substrate provided with a plurality of protruding sections formed on a surface of the single crystal semiconductor substrate and an insulating substrate provided with an amorphous semiconductor film formed on a surface of the insulating substrate; and executing a heat treatment on the amorphous semiconductor film while the plurality of protruding sections and the amorphous semiconductor film are in contact with each other.

2. The method of manufacturing a semiconductor element according to claim 1,
wherein in the executing of the heat treatment, the amorphous semiconductor film is melted by the heat treatment.

3. The method of manufacturing a semiconductor element according to claim 1,
wherein a plurality of single crystal grains corresponding to the plurality of protruding sections are formed in the amorphous semiconductor film by the executing of the heat treatment.

4. The method of manufacturing a semiconductor element according to claim 1 further comprising:
separating the single crystal semiconductor substrate and the insulating substrate from each other after the executing of the heat treatment.

5. The method of manufacturing a semiconductor element according to claim 1,
wherein the single crystal semiconductor substrate is made of single crystal silicon.

6. The method of manufacturing a semiconductor element according to claim 1,
wherein the plurality of protruding sections includes an oxide film formed on a surface of each of the plurality of protruding sections.

7. The method of manufacturing a semiconductor element according to claim 4,
wherein the plurality of protruding sections includes an oxide film formed on a surface of each of the plurality of protruding sections, and
the oxide film is removed in the separating of the single crystal semiconductor substrate and the insulating substrate.

8. The method of manufacturing a semiconductor element according to claim 1,
wherein each of the plurality of protruding sections is made of a porous material.

9. The method of manufacturing a semiconductor element according to claim 4,
wherein each of the plurality of protruding sections is made of a porous material, and the plurality of protruding sections is removed in the separating of the single crystal semiconductor substrate and the insulating substrate.

10. The method of manufacturing a semiconductor element according to claim 1,
wherein the executing of the heat treatment includes irradiating the amorphous semiconductor film with a laser beam from a side of an opposite surface of the insulating substrate to a surface on which the amorphous semiconductor film is formed.

11. A method of manufacturing a semiconductor device comprising the method of manufacturing a semiconductor element according to claim 1.

12. The method of manufacturing a semiconductor element according to claim 1,
wherein the insulating substrate is a light transmissive substrate.

13. The method of manufacturing a semiconductor element according to claim 1,
wherein a distance between each of the plurality of protruding sections is no greater than 2*R,
wherein R is a growth limitation distance of a crystalline of the amorphous semiconductor film.

14. The method of manufacturing a semiconductor element according to claim 3,
wherein the plurality of single crystal grains formed a crystalline semiconductor section.

15. The method of manufacturing a semiconductor element according to claim 14,
wherein the crystalline semiconductor section is formed at an area of a part of the insulating substrate.

* * * * *